(12) United States Patent
Matsubara et al.

(10) Patent No.: US 9,922,931 B2
(45) Date of Patent: Mar. 20, 2018

(54) INTERCONNECT STRUCTURE, PRINTED CIRCUIT BOARD, SEMICONDUCTOR DEVICE, AND MANUFACTURING METHOD FOR INTERCONNECT STRUCTURE

(71) Applicant: J-Devices Corporation, Usuki-shi, Oita (JP)

(72) Inventors: Hiroaki Matsubara, Yokohama (JP); Tomoshige Chikai, Yokohama (JP); Naoki Hayashi, Yokohama (JP); Toshihiro Iwasaki, Yokohama (JP)

(73) Assignee: J-DEVICES CORPORATION, Usuki-shi, Oita (JP)

( * ) Notice: Subject to any disclaimer, the term of this patent is extended or adjusted under 35 U.S.C. 154(b) by 0 days.

(21) Appl. No.: 15/419,091

(22) Filed: Jan. 30, 2017

(65) Prior Publication Data
US 2017/0263560 A1    Sep. 14, 2017

(30) Foreign Application Priority Data

Mar. 8, 2016  (JP) .................................. 2016-44081

(51) Int. Cl.
| | | |
|---|---|---|
| *H01L 23/48* | (2006.01) | |
| *H01L 23/52* | (2006.01) | |
| *H01L 23/538* | (2006.01) | |
| *H01L 21/768* | (2006.01) | |

(52) U.S. Cl.
CPC .... *H01L 23/5384* (2013.01); *H01L 21/76802* (2013.01); *H01L 21/76877* (2013.01); *H01L 23/5386* (2013.01)

(58) Field of Classification Search
CPC ............. H01L 23/5384; H01L 23/5386; H01L 21/76877

USPC .................................................. 257/774, 777
See application file for complete search history.

(56) References Cited

U.S. PATENT DOCUMENTS

| | | | | |
|---|---|---|---|---|
| 2009/0205860 A1* | 8/2009 | Kobayashi | ........... | H05K 1/0266 174/260 |
| 2009/0230541 A1* | 9/2009 | Araki | ...................... | H01L 24/18 257/693 |
| 2012/0326286 A1* | 12/2012 | Camacho | ............ | H01L 23/5389 257/676 |

FOREIGN PATENT DOCUMENTS

| | | |
|---|---|---|
| JP | H10-32201 A | 2/1998 |
| JP | 2007-165642 A | 6/2007 |

OTHER PUBLICATIONS

Concise Explanation of Relevance (1 page).

\* cited by examiner

*Primary Examiner* — David Vu
*Assistant Examiner* — Brandon Fox
(74) *Attorney, Agent, or Firm* — Flynn, Thiel, Boutell & Tanis, P.C.

(57) ABSTRACT

An interconnect structure in which the current capacity of an interconnect pattern involving a large amount of current is increased without preventing the miniaturization of signal lines and increasing the film thickness. The interconnect structure includes a resin layer; and interconnects formed on the resin layer, wherein the resin layer has a plurality of parallel grooves in an area in which the interconnects are formed, and the interconnects are formed of a plating film created on a resin layer front surface in the area, in which the interconnects are formed, and on inner wall surfaces of the plurality of grooves.

5 Claims, 7 Drawing Sheets

INTERCONNECT STRUCTURE, PRINTED CIRCUIT BOARD, SEMICONDUCTOR DEVICE, AND MANUFACTURING METHOD FOR INTERCONNECT STRUCTURE

BACKGROUND OF THE INVENTION

1. Field of the Invention

The present invention relates to an interconnect structure, printed circuit board, a semiconductor device, and a manufacturing method for the interconnect structure.

2. Description of the Related Art

An interconnect pattern formed on a semiconductor device or a printed circuit board needs to have a sectional area corresponding to the amount of current flowing through interconnects in order to prevent excessive heating of the interconnects during current conduction.

For example, in a power device or a control device, an interconnect pattern for a power supply system involving a large amount of current needs to have a large sectional area. However, an increase in interconnect width is limited.

A method for further increasing current capacity without increasing the interconnect width is to increase the thickness of the interconnects or to form a pattern by using a plurality of conductive layers in a multilayer board in parallel.

However, the method of increasing the thickness of the interconnects has the disadvantages of needing more time to plate the interconnects and precluding miniaturization based on a reduction in interconnect intervals between signal lines through which a large current need not flow.

The method of using a plurality of conductive layers in a multilayer circuit board in parallel is limited in the increase in the number of conductive layers.

Japanese Patent Publication No. H10-32201 describes photolithography masks used to form interconnect patterns and including a mask in which all interconnect patterns are drawn as mask patterns and a mask in which only interconnect patterns for large currents are drawn as mask patterns. These masks are used to form a thick interconnect pattern for a large amount of current, while forming a thin interconnect pattern for a small amount of current, thus allowing miniaturization.

In Japanese Patent Publication No. 2007-165642, a groove is formed in an insulating resin on an interconnect layer and filled with a conductive paste, and surfaces that are not in contact with the conductive paste are plated with copper. This increases the current capacity per unit width of pattern in one layer.

SUMMARY OF THE INVENTION

Problems to be Solved by the Invention

An object of the present invention is to provide an interconnect structure in which the current capacity of an interconnect pattern involving a large amount of current is increased without preventing a miniaturization of signal lines and increasing a film thickness.

To accomplish this object, an aspect of the present invention is configured as follows.

(1) An interconnect structure including:

a resin layer; and interconnects formed on the resin layer, wherein the resin layer has a plurality of parallel grooves in an area in which the interconnects are formed, and the interconnects are formed of a plating film created on a resin layer front surface in the area in which the interconnects are formed and on inner wall surfaces of the plurality of grooves.

(2) A printed circuit board including the interconnect structure set forth in (1).

(3) A semiconductor device including the interconnect structure set forth in (1).

(4) The semiconductor device according to (3), wherein the interconnects constituting the interconnect structure are in direct contact with a front surface of a semiconductor chip.

(5) A manufacturing method for an interconnect structure, the method including:

a step of forming a plurality of parallel grooves in a front surface of a resin layer in an area in which interconnects are formed; and a step of forming a plating film on a resin layer front surface in an area in which the interconnects are formed and on inner wall surfaces of the plurality of grooves.

The interconnect structure in the present invention enables a partial increase in current capacity of the interconnects without an increase in the plating thickness of the interconnects. As a result, the plating time needed to obtain the desired current capacity can be reduced, thereby enhancing productivity.

Compared to a case where a plating thickness is increased, a reduced plating thickness of the present invention precludes a hindrance to the miniaturization of signal lines.

BRIEF DESCRIPTION OF THE DRAWINGS

FIG. 1A is a sectional perspective view of the interconnect structure, and FIG. 1B is a sectional view of the interconnect structure prior to plating;

FIG. 2A depicts an interconnect structure in Embodiment 1, and FIG. 2B depicts a conventional interconnect structure;

FIG. 4A is a sectional view of the interconnect structure, and FIG. 4B illustrates the interconnect structure prior to plating; FIG. 5A is a sectional view of the interconnect structure, and FIG. 5B illustrates the interconnect structure prior to plating.

DESCRIPTION OF THE PREFERRED EMBODIMENTS

Embodiments of the present invention will be described below. The embodiments will be described below based on the drawings. However, the drawings are provided for description, and the present invention is not limited to the drawings.

Figure 1A:
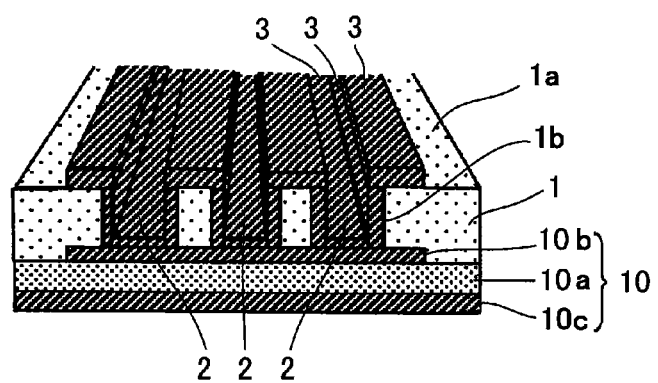
FIGS. 1A and 1B are diagrams depicting an interconnect structure according to Embodiment 1 of the present invention.

FIG. 1A depicts a basic example of an interconnect structure in the present invention.

The interconnect structure has a resin layer 1 and a plating film 3 constituting interconnects formed on the resin layer 1. The resin layer 1 is formed on the core member 10 including conductive films 10b and 10c laminated on the respective opposite surfaces of a core plate 10a.

Figure 1B:
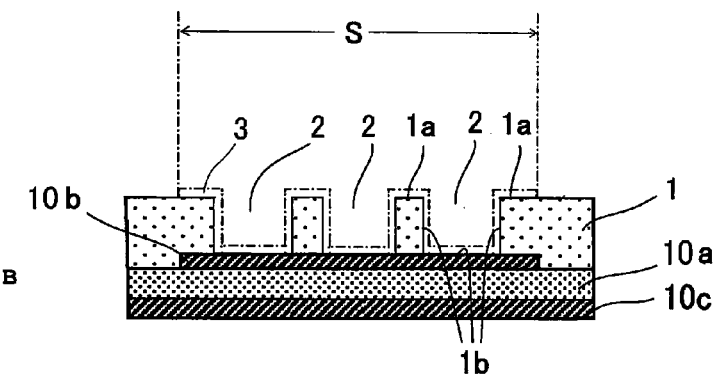

FIG. 1B is a diagram depicting a section of the resin layer 1 on which the plating film 3 is not yet formed. The resin layer 1 has a plurality of parallel grooves 2 in an area in which the plating film 3 is formed.

The plating film (interconnects) 3 is formed on inner wall surfaces 1b of the grooves 2 and on resin layer front surfaces 1a in the area where the interconnects are formed.

Such an interconnect structure is obtained by forming the plurality of parallel grooves 2 in the resin layer front surface 1a in an area S of the resin layer 1 on the core member 10 where the interconnects are formed and forming the plating film 3 on the inner wall surfaces 1b of the grooves 2 and the resin layer front surfaces 1a as depicted in FIG. 1B.

In FIG. 1B, the inner wall surfaces of the grooves refer to side surfaces and bottom surfaces (conductive film 10b) of the grooves.

Wiring formed of the plating film 3 as depicted in FIG. 1A is hereinafter sometimes referred to as groove-shaped interconnects.

Figure 2A:
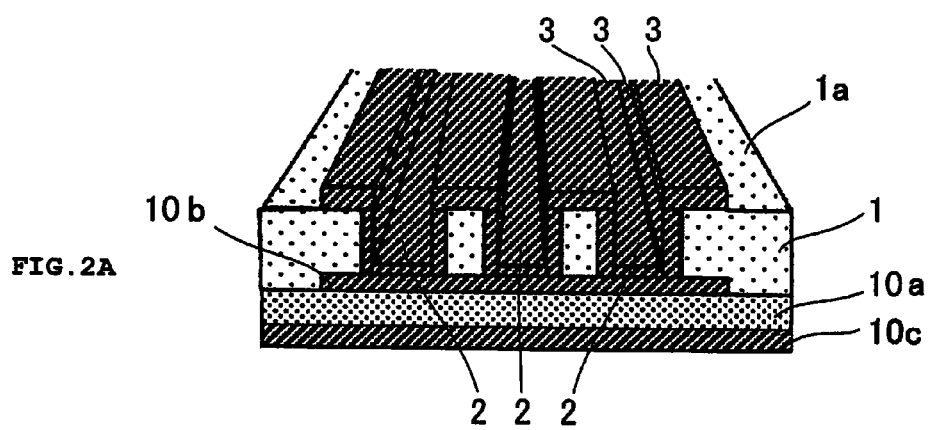
FIGS. 2A and 2B are diagrams comparing the interconnect structure in Embodiment 1 of the present invention with a conventional interconnect structure.
Figure 2B:
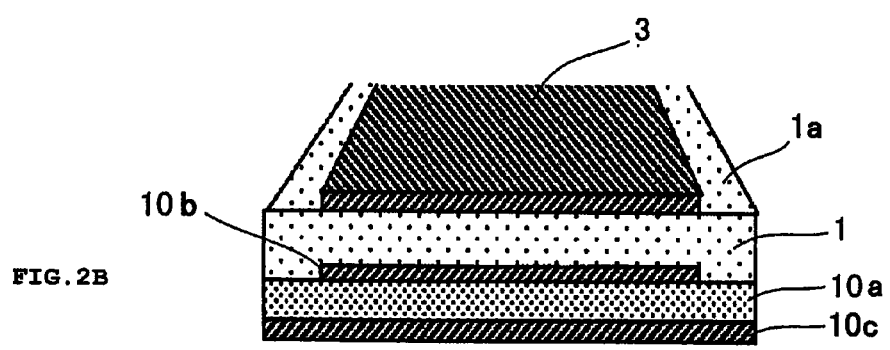

FIGS. 2A and 2B illustrate a comparison of an interconnect structure according to an embodiment of the present invention (see FIG. 2A) with an interconnect structure that is not the embodiment of the present invention (see FIG. 2B).

In the interconnect structure depicted in FIG. 2A, the plating film 3 is formed on side walls of the grooves 2 as well.

In the conventional interconnect structure depicted in FIG. 2B, the grooves 2 are not formed in the resin layer 1, and the plating film 3 is formed only on the resin layer front surfaces 1a of the resin layer 1.

Wiring resistance is expressed by Equation (1).

$$R = \rho \times \frac{L}{A} \quad (1)$$

(R: resistance, ρ: resistivity of copper, L: interconnect length, A: interconnect sectional area)

A comparison of the interconnect structure depicted in FIG. 2A with the interconnect structure depicted in FIG. 2B indicates that, compared to the interconnect structure depicted in FIG. 2B, the interconnect structure depicted in FIG. 2A includes conductor portions formed of the plating film on the side surfaces of the grooves, with these conductor portions being enlarged with those of the interconnect structure depicted in FIG. 2B. Therefore, the interconnect structure depicted in FIG. 2A has a larger interconnect sectional area A and a lower interconnect resistance R in Equation (1) than the interconnect structure depicted in FIG. 2B.

The current that can pass through the interconnects is limited to the degree that the current is prevented from excessively elevating temperature. However, the interconnect structure in the embodiment of the present invention depicted in FIG. 2A has a lower interconnect resistance R, and thus, a reduced amount of heat is generated by the interconnects during current conduction. Consequently, a larger current can pass through the interconnect structure.

Now, an embodiment of the interconnect structure in the present invention will be described.

Embodiment 1

The present embodiment relates to a printed circuit board having the interconnect structure according to the present invention.

Steps for producing a printed circuit board having the interconnect structure depicted in FIGS. 1A and 1B will be described below based on FIGS. 3A to 3N.

Figure 3A:
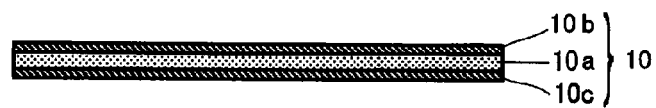
FIGS. 3A to 3G are diagrams each showing a part of a manufacturing process for an interconnect structure according to Embodiment 1 of the present invention, including steps until after grooves have been formed in a resin layer.

(Step 1) See FIG. 3A.

The core member 10 is prepared which includes the conductive films 10b and 10c laminated on the respective opposite surfaces of the core plate 10a.

Figure 3B:
Figure 3C:
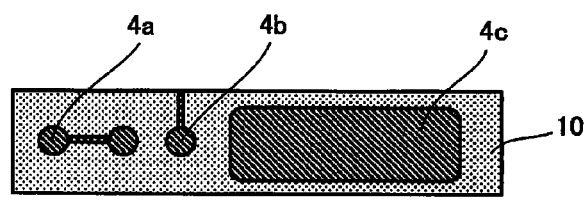

(Step 2) See FIGS. 3B and 3C.

An unwanted part of the conductive film 10b on one side of the core member 10 is melted and removed with a chemical to form conductive patterns 4a, 4b, and 4c needed as interconnects.

FIG. 3C is a top view of the core member 10 depicted in FIG. 3B.

Figure 3D:
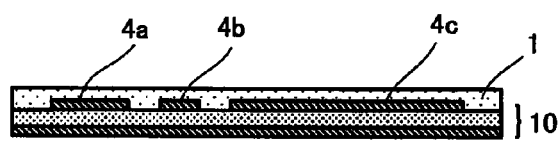

(Step 3) See FIG. 3D.

Resin is accumulated on the core member 10 with the conductive patterns 4a, 4b, and 4c formed thereon, to form a resin layer 1.

Figure 3E:
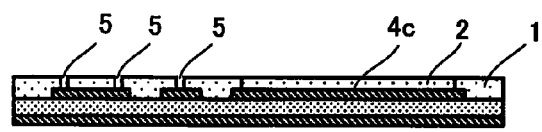
Figure 3F:
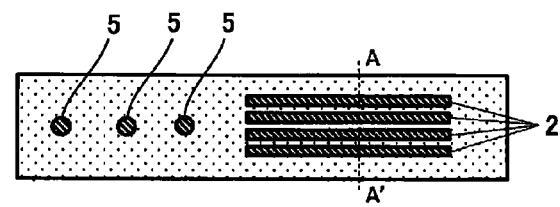
Figure 3G:
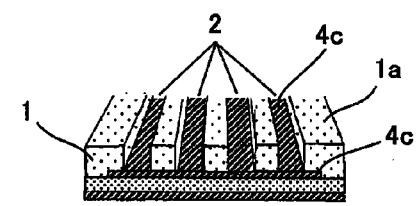

(Step 4) See FIGS. 3E to 3G.

On the resin layer 1, grooving is performed in which the plurality of grooves 2 for large-current interconnects are formed and drilling is further performed in which via openings 5 for signal lines are formed. In the present embodiment, four grooves 2 are formed.

The drilling can be performed using a $CO_2$ laser or a THG laser. The grooving is preferably performed by excimer laser ablation.

When the grooves 2 and the via openings 5 are formed by laser processing, the conductive patterns 4a, 4b, and 4c are provided to control the depths of the grooves 2 and the via openings 5. That is, if the laser light has an energy with a value equal to or smaller than a predetermined value, a conductive film forming the conductive patterns 4a, 4b, and 4c acts as a barrier to stop the formation of the grooves 2 and the via openings 5 directly before the depth of the conductive patterns 4a, 4b, and 4c (upper side of the figures).

FIG. 3F is a top view of a laminated body including the core member 10 and the resin layer 1 depicted in FIG. 3E. FIG. 3G is a sectional perspective view of the laminated body depicted in FIG. 3F and is taken along line A-A' in FIG. 3F.

FIG. 3G illustrates that the conductive pattern 4c at the bottom surfaces of the grooves 2 formed in the resin layer 1 is exposed.

Figure 3H:
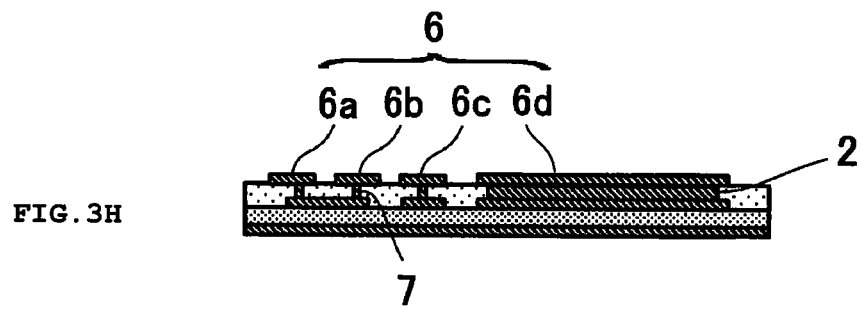
FIGS. 3H to 3J are diagrams each showing a part of the manufacturing process for an interconnect structure according to Embodiment 1 of the present invention, including steps in which openings and grooves formed in the resin layer are plated to form a plating film.
Figure 3I:
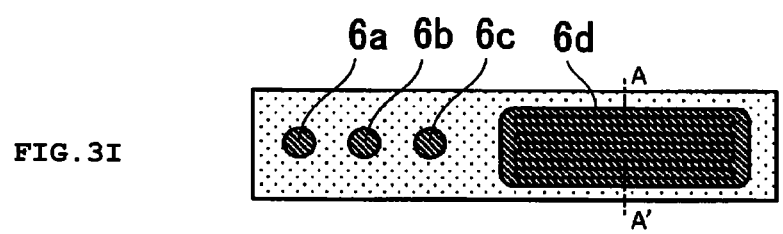
Figure 3J:
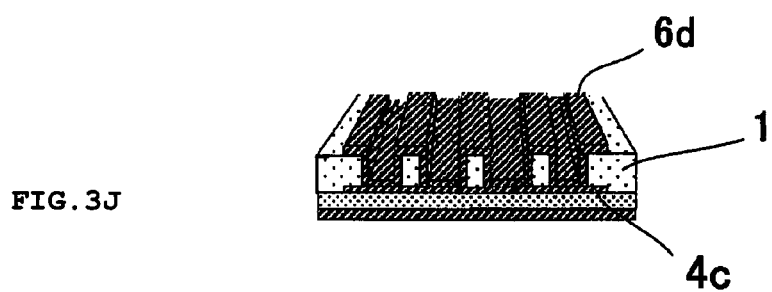

(Step 5) See FIGS. 3H to 3J.

Seeding is performed on inner wall surfaces of the grooves 2, peripheral portions of the grooves 2, the via openings 5, and peripheral portions thereof in the laminated body depicted in FIG. 3E. Then, conductive films are formed by electroless plating, and vias 7 and interconnects 6 (interconnects 6a, 6b, 6c, and 6d) are formed by electroplating.

The interconnects 6a, 6b, and 6c are utilized as small-current conduction interconnects such as signal lines.

The interconnect 6d is a groove-shaped interconnect and is utilized as a large-current conduction interconnect.

FIG. 3I is a top view of the laminated body depicted in FIG. 3H.

FIG. 3J is a sectional perspective view of the laminated body depicted in FIG. 3I and is taken along line A-A' in FIG. 3I.

Figure 3K:
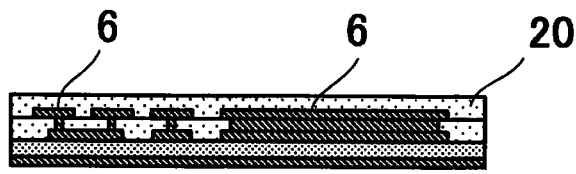
FIGS. 3K to 3N are diagrams each showing a part of the manufacturing process for an interconnect structure according to Embodiment 1 of the present invention, including steps until after a solder resist film has been formed after forming vias and interconnects in the resin layer on interconnects.

(Step 6) See FIG. 3K.

A resin layer 20 is formed on an upper surface of the laminated body depicted in FIG. 3H.

Figure 3L:
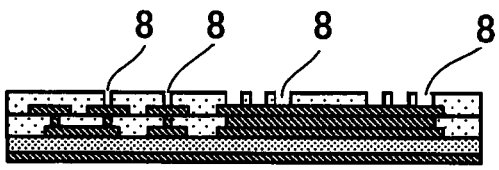

(Step 7) See FIG. 3L.

Via openings 8 are formed, by laser processing, in the resin layer 20 in the laminated body depicted in FIG. 3K.

Figure 3M:
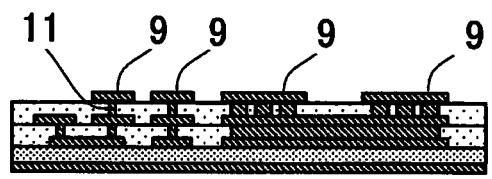

(Step 8) See FIG. 3M.

Via openings 8 in the laminated body depicted in FIG. 3K and peripheral portions of the via openings 8 are plated to form vias 11 and interconnects 9.

Figure 3N:
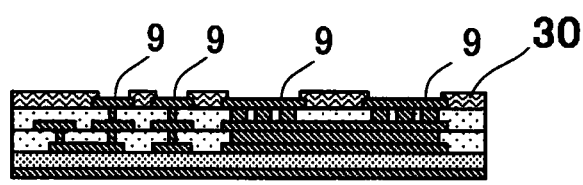

(Step 9) See FIG. 3N.

A solder resist film 30 is formed which includes exposed portions (interconnects 9) serving as external connection pads. Thus, a printed circuit board is obtained.

The printed circuit board in the present embodiment includes the interconnect structure in the present invention and thus enables a partial increase in the current capacity of the interconnects without increasing the plating thickness. As a result, the plating time needed to obtain a desired current capacity can be reduced, enhancing the productivity. Compared to a case where a plating thickness is increased, the reduced plating thickness of the present invention precludes a hindrance to the miniaturization of signal lines.

Embodiment 2

The present embodiment relates to a semiconductor device that includes a power device or a control device embedded therein and interconnects formed by plating and in which the plated interconnects include connection structures according to the present invention.

Figure 4A:
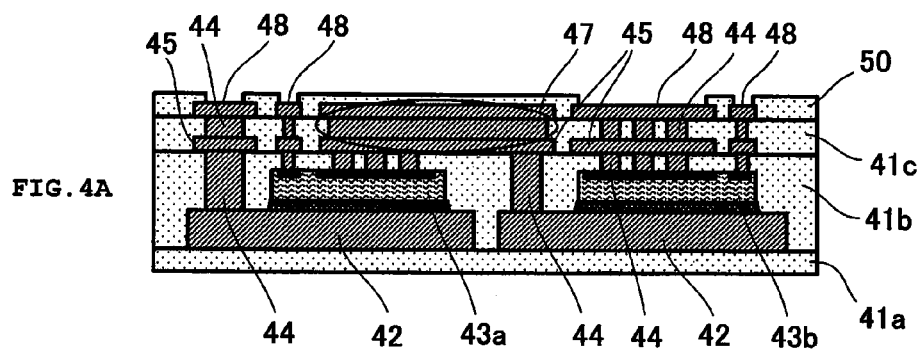
FIGS. 4A and 4B are diagrams depicting an interconnect structure according to Embodiment 2 of the present invention.

The present embodiment will be described based on FIG. 4A.

Interconnects 42 are formed on a resin layer 41a.

Semiconductor chips 43a and 43b are secured onto the interconnects 42 via insulating materials and sealed with a resin layer 41b.

Interconnects 45 are formed on a front surface of the resin layer 41b by plating.

On a front surface of the resin layer 41b, vias 44 are formed which connect electrode pads for the semiconductor chips 43a and 43b to the interconnects 45.

Vias 44 are also formed in the resin layer 41b to electrically connect the interconnects 42 and the interconnects 45 together.

The interconnects 45 are embedded in a resin layer 41c. The vias 44 and a groove-shaped interconnect 47 are formed in the resin layer 41c.

Interconnects 48 are formed on a front surface of the resin layer 41c by plating. On a front surface of the resin layer 41c, a solder resist layer 50 is formed which has openings through each of which a part of the corresponding interconnect 48 is exposed.

The groove-shaped interconnect can be formed executing a series of steps illustrated in FIGS. 3D to 3J on the resin layer 41c.

The steps of forming the groove-shaped interconnect will be described below.

The interconnects 45 are formed on the surface of resin layer 41b sealing the semiconductor chips 43a and 43b.

The resin layer 41c is accumulated on the interconnects 45.

Figure 4B:
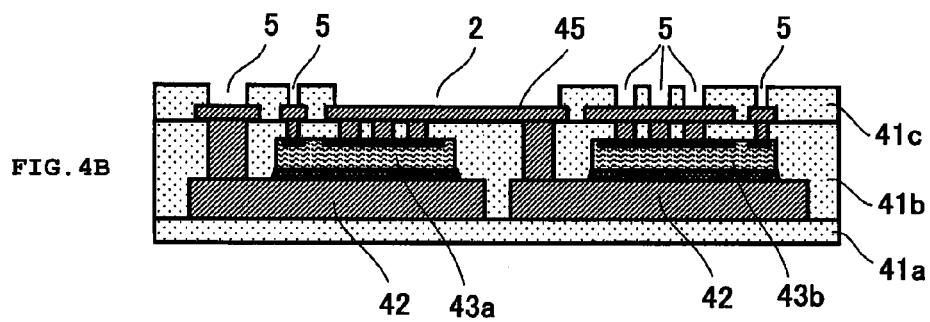

As depicted in FIG. 4B, on the resin layer 41c, drilling is further performed in which via openings 5 for signal lines are formed and grooving is performed in which the plurality of grooves 2 for large-current interconnects are formed.

The via openings 5, peripheral portions of the via openings 5, and inner wall surfaces and peripheral portions of the grooves 2 are plated to form the vias 44, the interconnects 48, and the groove-shaped interconnect 47.

The interconnects 48 produced as described above are utilized as small-current conduction interconnects such as signal lines. The groove-shaped interconnect 47 is utilized as a large-current conduction interconnect.

The present embodiment produces effects similar to the effects of Embodiment 1 on a semiconductor device with interconnects formed by plating.

Embodiment 3

The present embodiment relates to a semiconductor device that includes a power device or a control device embedded therein and interconnects formed by plating and in which the plated interconnects include connection structures according to the present invention.

Figure 5A:
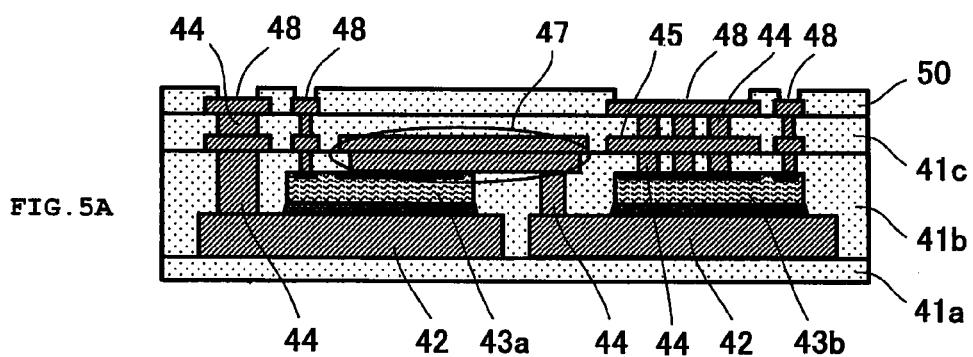
FIGS. 5A and 5B are diagrams depicting an interconnect structure according to Embodiment 3 of the present invention.

As depicted in FIG. 5A, the semiconductor device in the present embodiment is structured such that the groove-shaped interconnect 47 is in direct contact with the semiconductor chip 43a.

Figure 5B:
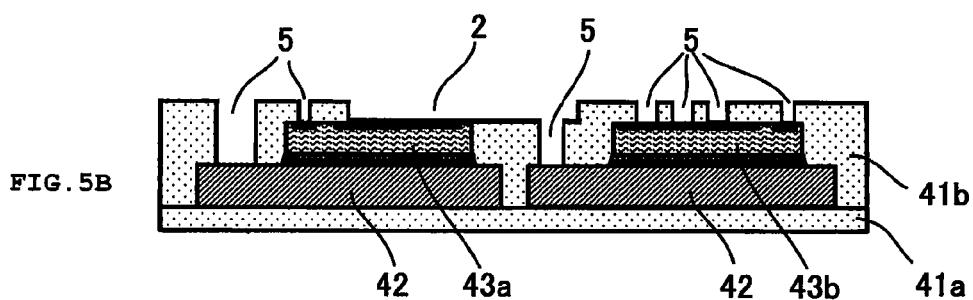

To form such an interconnect structure, first, grooves 2 are formed which extend from a front surface of the resin layer 41b with semiconductor chips 43a and 43b sealed therein and which reach a front surface of the semiconductor chip 43a, and openings 5 are formed which also extend from the front surface of the resin layer 41b and which reach front surfaces of the interconnects 42, as depicted in FIG. 5B.

Normally, Al pads, SiN, and the like are exposed from the front surfaces of the semiconductor chips 43a. If a $CO_2$ laser is used to form the grooves 2, when the semiconductor chips are irradiated directly with $CO_2$ laser light, prevention of damages to the semiconductor chip 43a is difficult.

However, since the etch rate of Al pads or SiN is lower and involves higher etch selectivity than the etch rate of a resin, processing can be stopped at the front surfaces of the Al pads or SiN when an excimer laser is used for drilling that allows via openings to be formed and for grooving. Furthermore, ablation processing such as this has only a low thermal effect on the semiconductor chips. Thus, as a laser, an excimer laser is preferably used.

After the grooves 2 and the via openings 5 depicted in FIG. 5B are formed, the via openings 5, peripheral portions of the via openings 5, inner wall surfaces and peripheral portions of the grooves 2 are plated to form the vias 44, the interconnects 45, and the groove-shaped interconnect 47.

Then, the resin layer 41c is accumulated on the vias 44 and the groove-shaped interconnect 47. The vias 44 are formed in the resin layer 41c, and the interconnects 48 are formed on a front surface of the resin layer 41c.

Then, the solder resist layer 50 is formed which has openings through each of which a part of the corresponding interconnect layer is exposed on the surface of the resin layer 41c. Compared to Embodiment 2, Embodiment 3 eliminates the need to further increase interconnects in order to allow groove-shaped interconnects to be produced, thereby enabling the provision of a semiconductor device with a reduced number of layers.

What is claimed is:

1. An interconnect structure including:
   a resin layer; and
   interconnects formed on the resin layer, wherein
   the resin layer has a plurality of grooves in an area in which the interconnects are formed, the grooves being formed in the front surface of the resin layer, extending in a direction parallel to the front surface of the resin layer and are parallel to each other and
   the interconnects are formed of a plating film created on a resin layer front surface in the area, in which the interconnects are formed, and on inner wall surfaces of the plurality of grooves.

2. A printed circuit board including the interconnect structure according to claim 1.

3. A semiconductor device including the interconnect structure according to claim 1.

4. The semiconductor device according to claim 3, wherein the interconnects constituting the interconnect structure are in direct contact with a front surface of a semiconductor chip.

5. A manufacturing method for an interconnect structure, the method including:
   a step of forming a plurality of grooves in a front surface of a resin layer in an area in which interconnects are formed, the grooves extending in a direction parallel to the front surface of the resin layer and are parallel to each other; and
   a step of forming a plating film on a resin layer front surface in an area in which the interconnects are formed and on inner wall surfaces of the plurality of grooves.

* * * * *